United States Patent [19]
Chen et al.

[11] Patent Number: 5,395,797
[45] Date of Patent: Mar. 7, 1995

[54] ANTIFUSE STRUCTURE AND METHOD OF FABRICATION

[75] Inventors: Kueing-Long Chen, Plano; Ashwin H. Shah, Dallas, both of Tex.; David K. Liu, Sunnyvale, Calif.

[73] Assignee: Texas Instruments Incorporated, Dallas, Tex.

[21] Appl. No.: 150,749

[22] Filed: Nov. 12, 1993

Related U.S. Application Data

[63] Continuation of Ser. No. 984,034, Dec. 1, 1992, abandoned.

[51] Int. Cl.⁶ .......................................... H01L 21/283
[52] U.S. Cl. ...................................... 437/195; 437/51; 437/52; 437/192; 437/922; 148/DIG. 55
[58] Field of Search .................. 437/195, 192, 51, 52, 437/922; 148/DIG. 55; 257/529, 530

[56] References Cited

U.S. PATENT DOCUMENTS

| | | | |
|---|---|---|---|
| 5,059,555 | 10/1991 | Iranmanesh et al. | 257/529 |
| 5,166,556 | 11/1992 | Hsu et al. | 257/530 |
| 5,171,715 | 12/1992 | Husher et al. | 437/922 |
| 5,196,724 | 3/1993 | Gordon et al. | 257/530 |

OTHER PUBLICATIONS

Kueing-Long Chen, David K. Y. Liu, George Misium, W. Milton Gosney, Shoue-Jen Wang, Janet Camp and Howard Tigelaar, "A Sublithographic Antifuse Structure for Field-Programmable Gate Array Applications", *IEEE Electron Device Letters,* vol. 13, No. 1, Jan. 1992, pp. 53–55.

*Primary Examiner*—Brian E. Hearn
*Assistant Examiner*—Kevin M. Picardat
*Attorney, Agent, or Firm*—Mark E. Courtney; Robby T. Holland; Richard L. Donaldson

[57] ABSTRACT

An antifuse structure (20) and method of fabrication are provided. A first conductive layer (A) is etched according to a first mask (62a) having a first pattern and according to a second mask (64a) having a second pattern. A first insulative layer (30) is disposed over the first conductive layer (A) and etched according to a third mask (40a) having a third pattern to expose at least one section of the first conductive layer (A). A second insulative layer (26) is disposed adjacent at least one exposed section of the first conductive layer (A). A second conductive layer (1) is disposed over the second insulative layer (26) so that the antifuse structure (20) includes at least one antifuse region (A1) where a section of the second insulative layer (26) is adjacent the first (A) and second (1) conductive layers. The antifuse region (A1) has a sublithographic vertical dimension (t) according to a thickness of the first conductive layer (A). Further, the antifuse region (A1) has a sublithographic horizontal dimension (L) according to an overlap between the first (62a) and second (64a) masks.

12 Claims, 5 Drawing Sheets

ANTIFUSE STRUCTURE AND METHOD OF FABRICATION

This application is a continuation of application Ser. No. 07/984,034, filed Dec. 1, 1992, now abandoned.

CROSS-REFERENCES TO RELATED APPLICATIONS

This patent application is related to copending U.S. patent application Ser. No. 07/954,593, entitled SIDEWALL ANTI-FUSE STRUCTURE AND METHOD FOR MAKING, by Liu et al., filed Sep. 30, 1992, which is a continuation of U.S. patent application Ser. No. 07/657,703, entitled SIDEWALL ANTI-FUSE STRUCTURE AND METHOD FOR MAKING, by Liu et al., filed Feb. 19, 1991, now abandoned.

TECHNICAL FIELD OF THE INVENTION

This invention relates in general to semiconductor devices, and in particular to an antifuse structure and method of fabrication.

BACKGROUND OF THE INVENTION

It is desirable to lower the programming voltage for programming an antifuse into a conduction state. By having a low programming voltage, the gate oxide thickness of a programming transistor can be equal to that of a low-voltage transistor. Moreover, a low programming voltage reduces the diode junction breakdown voltage requirement for submicrometer technologies.

With dielectric-based antifuse technology, antifuse programming voltages have been lowered by reducing dielectric thickness. Some previous techniques use a nitride/oxide ("NO") dielectric having an equivalent oxide thickness of 65 Angstroms. According to such previous techniques, a scaled poly-poly antifuse can be programmed into a conduction state by a programming voltage of approximately 10.6 volts. According to previous techniques using an ONO dielectric, an antifuse can be programmed into a conduction state by a programming voltage of approximately 14.2 volts.

Nevertheless, by reducing dielectric thickness, the capacitance of an unprogrammed antifuse has increased. In a circuit based on antifuse interconnect architecture, such an increased capacitance degrades circuit speed performance and increases interconnect switching power dissipation. The capacitance is a function of dielectric area at the antifuse interface ("antifuse area") between two conductors.

Conventional planar contact-hole antifuses have acceptable time-dependent dielectric breakdown ("TDDB") reliability. Nevertheless, with previous techniques for fabricating antifuse structures within contact holes, antifuse area is difficult to reduce, and a reduction in antifuse cell size to approximately 0.2×0.2 $\mu m^2$ would rely upon an advanced lithographic capability of approximately 0.2 $\mu m$.

Thus, a need has arisen for an antifuse structure and method of fabrication, in which antifuse area is reduced by more than approximately one order of magnitude, relative to previous techniques for fabricating antifuse structures within contact holes. Also, a need has arisen for an antifuse structure and method of fabrication, in which an antifuse cell size of approximately 0.2×0.2 $\mu m^2$ is achieved without relying upon an advanced lithographic capability of approximately 0.2 $\mu m$. Further, a need has arisen for an antifuse structure and method of fabrication, in which capacitance of an unprogrammed antifuse is reduced, circuit speed performance is increased, and interconnect switching power dissipation is reduced. Moreover, a need has arisen for an antifuse structure and method of fabrication, in which time-dependent dielectric breakdown ("TDDB") reliability is at least comparable to TDDB reliability of conventional planar contact-hole antifuses.

SUMMARY OF THE INVENTION

In a first aspect of an antifuse structure and method of fabrication, a first conductive layer is etched according to a first mask having a first pattern and according to a second mask having a second pattern. A first insulative layer is disposed over the first conductive layer and etched according to a third mask having a third pattern to expose at least one section of the first conductive layer. A second insulative layer is disposed adjacent at least one exposed section of the first conductive layer. A second conductive layer is disposed over the second insulative layer so that the antifuse structure includes at least one antifuse region where a section of the second insulative layer is adjacent the first and second conductive layers. The antifuse region has a sublithographic vertical dimension according to a thickness of the first conductive layer. Further, the antifuse region has a sublithographic horizontal dimension according to an overlap between the first and second masks.

In a second aspect, a first conductive layer is etched according to a first mask having a first pattern. A first insulative layer is disposed over the first conductive layer and etched according to a second mask having a second pattern to expose at least one section of the first conductive layer. A second insulative layer is disposed adjacent at least one exposed section of the first conductive layer. A second conductive layer is disposed over the second insulative layer so that the antifuse structure includes at least one antifuse region where a section of the second insulative layer is adjacent the first and second conductive layers. The antifuse region has a sublithographic vertical dimension according to a thickness of the first conductive layer. Further, the antifuse region has a sublithographic horizontal dimension according to an offset of the second conductive layer relative to the first conductive layer.

It is a technical advantage of the present invention that antifuse area is reduced by more than approximately one order of magnitude, relative to previous techniques for fabricating antifuse structures within contact holes.

It is another technical advantage of the present invention that an antifuse cell size of approximately 0.2×0.2 $\mu m^2$ is achieved without relying upon an advanced lithographic capability of approximately 0.2 $\mu m$.

It is a further technical advantage of the present invention that capacitance of an unprogrammed antifuse is reduced, circuit speed performance is increased, and interconnect switching power dissipation is reduced.

It is yet another technical advantage of the present invention that time-dependent dielectric breakdown ("TDDB") reliability is at least comparable to TDDB reliability of conventional planar contact-hole antifuses.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1-9 of the drawings, like numerals being used for like and corresponding parts of the various drawings.

Figure 1:
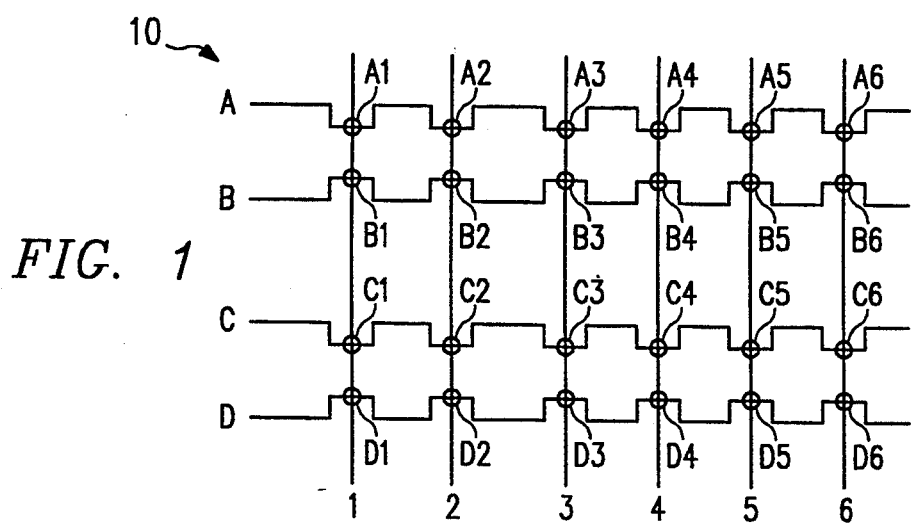
FIG. 1 is an electrical schematic diagram of an antifuse array layout of the preferred and alternative embodiments.

FIG. 1 is an electrical schematic diagram of an antifuse array layout, indicated generally at 10, of the preferred and alternative embodiments. Any of lines A, B, C and D can be connected to any of lines 1, 2, 3, 4, 5 and 6 by programming a corresponding one of antifuse regions A1-A6, B1-B6, C1-C6 and D1-D6. For example, line B is connected to line 5 by programming corresponding antifuse region B5. Similarly, line D is connected to line 3 by programming corresponding antifuse region D3.

Figure 3:
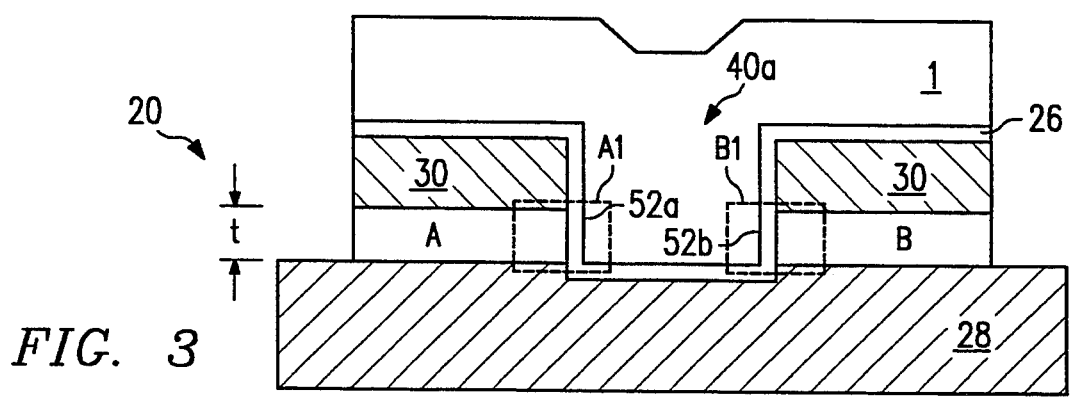
FIG. 3 is a sectional view of the antifuse structure of FIG. 2, taken substantially along line 3—3 in FIG. 2.
Figure 2:
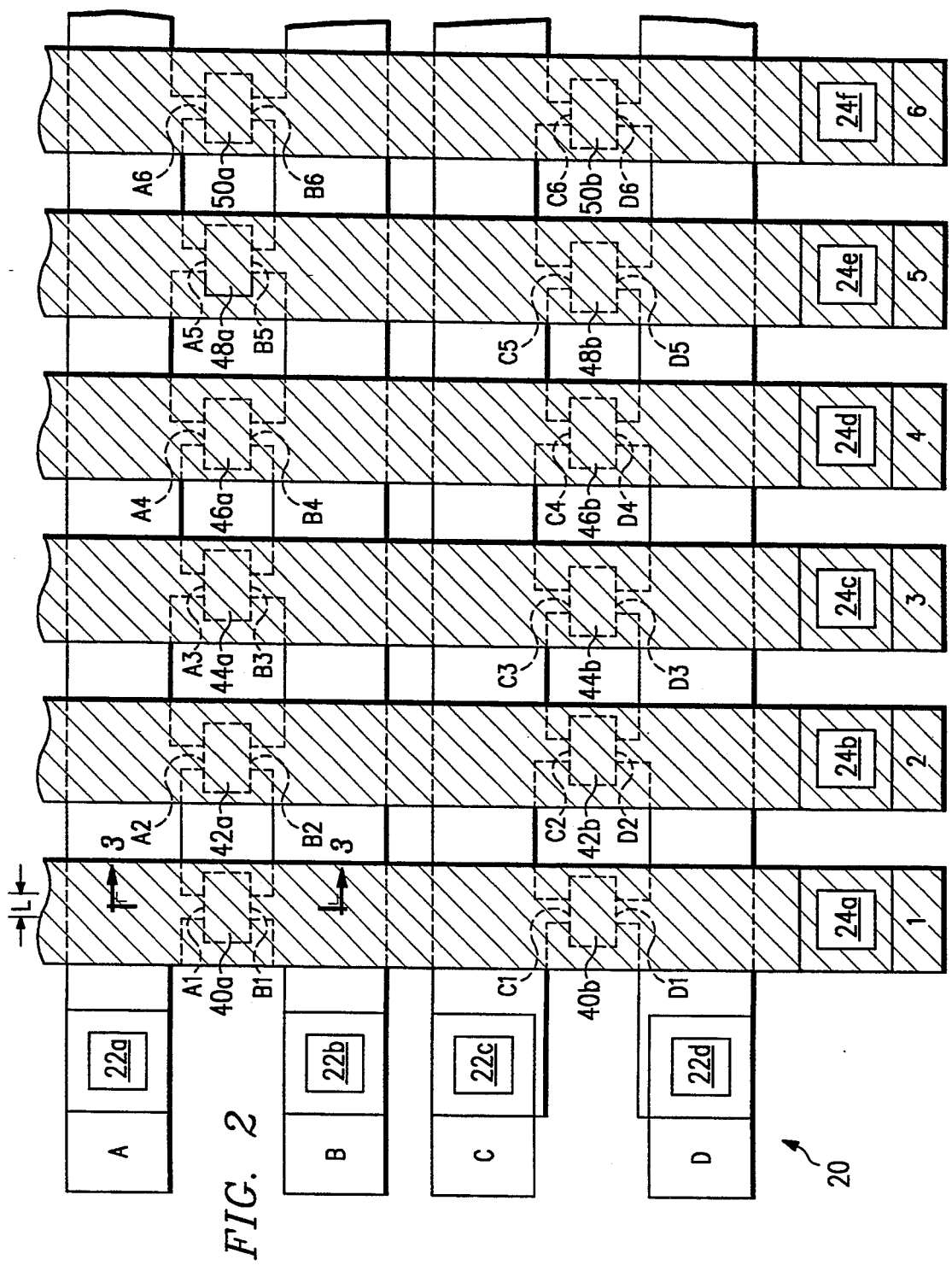
FIG. 2 is a plan view of an antifuse structure of the preferred embodiment, according to the antifuse array layout of FIG. 1.

FIG. 2 is a plan view of an antifuse structure, indicated generally at 20, of the preferred embodiment, according to antifuse array layout 10 of FIG. 1. FIG. 3 is a sectional view of antifuse structure 20 of FIG. 2, taken substantially along line 3—3 in FIG. 2. As in FIG. 1, in FIG. 2 any of lines A, B, C and D can be connected to any of lines 1, 2, 3, 4, 5 and 6 by programming a corresponding one of antifuse regions A1-A6, B1-B6, C1-C6 and D1-D6. Lines A, B, C and D are externally interfaced to other circuitry by contact regions 22a-d, respectively. Similarly, lines 1, 2, 3, 4, 5 and 6 are externally interfaced to other circuitry by contact regions 24a-f, respectively.

Referring to FIG. 3, antifuse regions A1 and B1 are indicated generally by dashed enclosures. Antifuse regions A1 and B1 are representative ones of antifuse regions A1-A6, B1-B6, C1-C6 and D1-D6. As shown in FIG. 3, antifuse region A1 includes a section of a dielectric layer 26 adjacent line 1 and line A. Similarly, antifuse region B1 includes another section of dielectric layer 26 adjacent line 1 and line B.

As an example, line 1 is connected to line A by programming corresponding antifuse region A1. Antifuse region A1 is programmed in response to a suitable programming voltage between line 1 and line A. Such a programming voltage melts the section of dielectric layer 26 in antifuse region A1, so that line 1 is electrically connected to line A. When line 1 is electrically connected to line A, electrical current can flow between line 1 and line A with relatively little resistance.

Similarly, line 1 is connected to line B by programming corresponding antifuse region B1. In response to a suitable programming voltage between line 1 and line B, the section of dielectric layer 26 in antifuse region B1 is melted, independent of the section of dielectric layer 26 in antifuse region A1. Accordingly, antifuse region B1 is programmable independently of antifuse region A1.

As shown in FIG. 3, line A and line B are deposited over a thick silicon dioxide ("oxide") layer 28. With continuing reference to FIG. 3, outside of antifuse regions A1 and B1, line 1 is insulated from line A and from line B by dielectric layer 26 together with a TEOS oxide layer 30. For clarity, FIG. 2 does not show dielectric layer 26, oxide layer 28, and TEOS oxide layer 30.

TEOS oxide layer 30 helps ensure that, in response to a suitable programming voltage between line 1 and line A, only the section of dielectric layer 26 in antifuse region A1 is melted. Likewise, TEOS oxide layer 30 helps ensure that, in response to a suitable programming voltage between line 1 and line B, only the section of dielectric layer 26 in antifuse region B1 is melted, independent of the section of dielectric layer 26 in antifuse region A1.

Notably, two sidewall antifuse regions, A1 and B1, are situated in a single antifuse window indicated by dashed enclosure 40a of FIG. 2. Similarly, antifuse regions C1 and D1 are situated in an antifuse window indicated by dashed enclosure 40b. Analogously, antifuse structure 20 includes antifuse windows indicated by dashed enclosures 42a (for antifuse regions A2 and B2), 42b (for antifuse regions C2 and D2), 44a (for antifuse regions A3 and B3), 44b (for antifuse regions C3 and D3), 46a (for antifuse regions A4 and B4), 46b (for antifuse regions C4 and D4), 48a (for antifuse regions A5 and B5), 48b (for antifuse regions C5 and D5), 50a (for antifuse regions A6 and B6), and 50b (for antifuse regions C6 and D6).

As shown in FIG. 3, antifuse regions A1 and B1 are respectively situated in antifuse window 40a along vertical sidewalls 52a-b of line 1, such that antifuse structure 20 is a sublithographic sidewall antifuse structure. Antifuse structure 20 is fabricated so that respective areas of antifuse regions A1 and B1 are each defined by a vertical dimension and a horizontal dimension. For example, the vertical dimension of antifuse region A1 is a thickness t (FIG. 3) of line A. The horizontal dimension of antifuse region A1 is a width L (FIG. 2) resulting from a two-mask patterning and etching technique discussed further hereinbelow in connection with FIGS. 4a-c.

The respective areas of antifuse regions A1-A6, B1-B6, C1-C6 and D1-D6 are substantially equal to one another. In FIGS. 2 and 3, an antifuse cell size of antifuse structure 20 is approximately $0.2 \times 0.2$ $\mu m^2$. Advantageously, by significantly reducing the respective areas of antifuse regions A1-A6, B1-B6, C1-C6 and D1-D6, likewise the capacitance of antifuse structure 20 is significantly reduced.

Figure 4A:
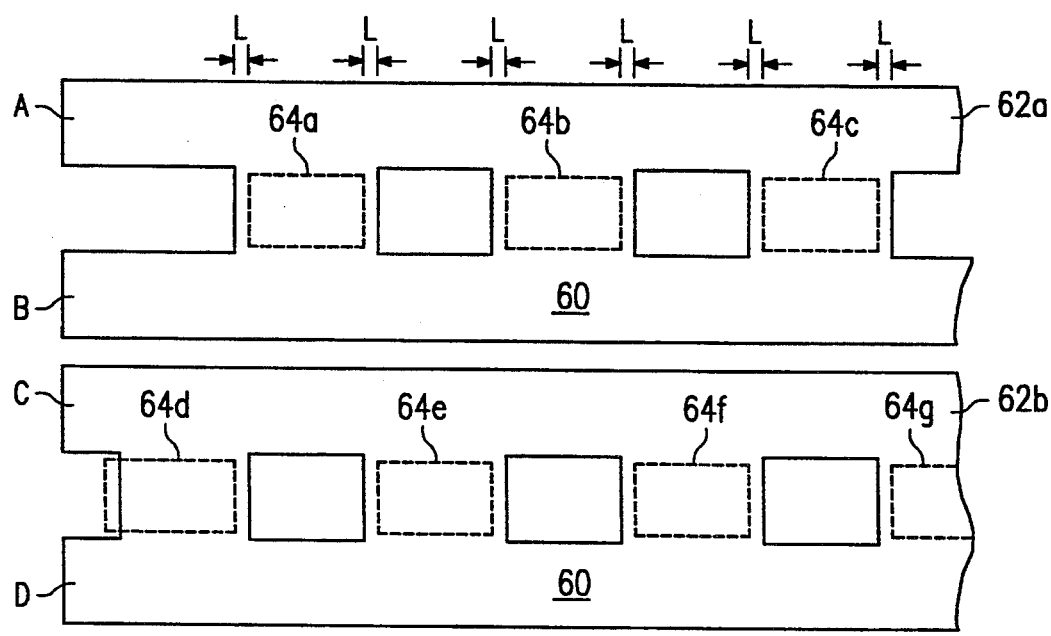
FIGS. 4a-b illustrate processing steps to fabricate the antifuse structure of FIG. 2.
Figure 4B:
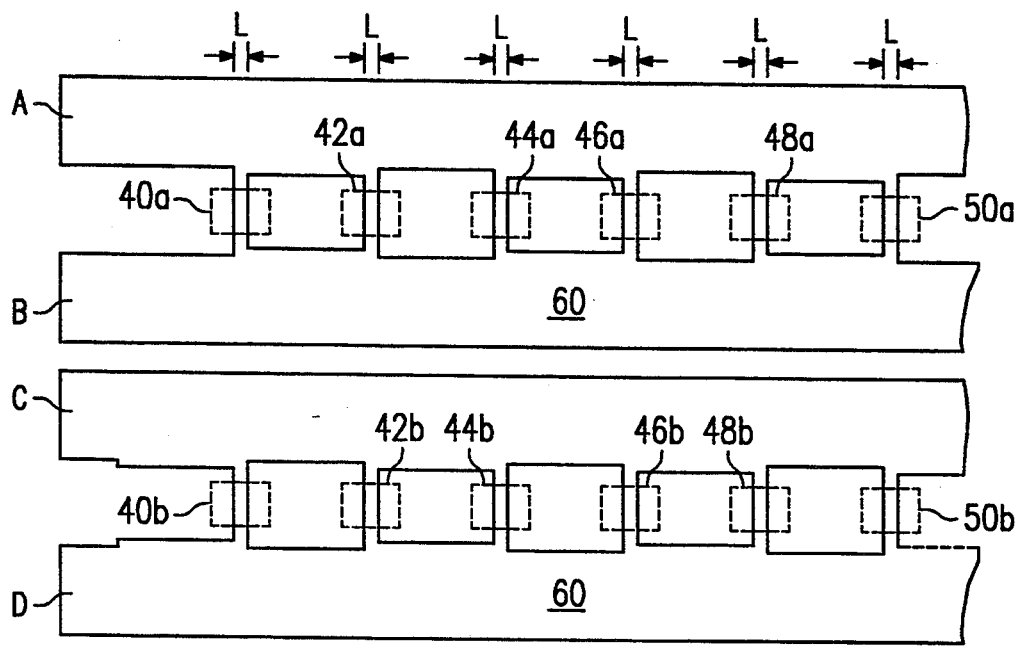

FIGS. 4a-b illustrate processing steps to fabricate antifuse structure 20 of FIG. 2. Initially, thick oxide layer 28 (FIG. 3) is thermally grown over an entire area on which antifuse structure 20 is to be formed. Over thick oxide layer 28, a conductive LPCVD polysilicon layer 60 is deposited at a thickness of approximately 2000-4000 Angstroms and then etched as shown in FIG. 4a. Lines A, B, C and D are formed by etching polysilicon layer 60 as discussed further hereinbelow in connection with FIG. 4b. Accordingly, the thickness t of polysilicon layer 60 controls the sublithographic vertical dimension of each of antifuse regions A1-A6, B1-B6, C1-C6 and D1-D6. In fabricating sublithographic antifuse structure 20, thickness t of polysilicon layer 60 is controlled to be significantly less than otherwise definable by conventional photolithographic techniques.

In a significant aspect of the preferred embodiment, referring to FIG. 4a, polysilicon layer 60 is patterned and etched twice in order to achieve a sublithographic horizontal dimension for width L of each of antifuse regions A1-A6, B1-B6, C1-C6 and D1-D6. In the first etching, polysilicon layer 60 is etched according to a first mask having the pattern shown in FIG. 4a by solid lines 62a and 62b. In the second etching, polysilicon layer 60 is etched according to a second mask having the pattern shown in FIG. 4a by dashed lines 64a-g.

Width L is a function of the process etch bias and of the overlap between the first and second masks as indicated by the dimensions of dashed lines 64a-g. By modifying the overlap of the second mask relative to the first mask, antifuse structure 20 has been successfully fabricated with dimensions for width L of approximately 0.2, 0.3, 0.4, 0.6 and 0.8 $\mu$m. Similarly, an additional mask can be optionally used to further pattern and etch polysilicon layer 60, such that width L is further reduced to decrease the respective areas of antifuse regions A1-A6, B1-B6, C1-C6 and D1-D6. The minimum dimension of width L is a function of the effects of overlay tolerance and polysilicon etching bias.

After the first and second etchings of polysilicon layer 60, n+ type phosphorous or arsenic dopants are implanted and annealed in polysilicon layer 60. Then, TEOS oxide layer 30 (FIG. 3) is deposited at a thickness of approximately 2000 Angstroms. After depositing TEOS oxide layer 30 (FIG. 3), antifuse windows 40a-b, 42a-b, 44a-b, 46a-b, 48a-b and 50a-b are patterned as shown in FIG. 4b.

An oxide/polysilicon stacked etch is used to cut through patterned antifuse windows 40a-b, 42a-b, 44a-b, 46a-b, 48a-b and 50a-b, so that both TEOS oxide layer 30 and polysilicon layer 60 are etched in the areas of antifuse windows 40a-b, 42a-b, 44a-b, 46a-b, 48a-b and 50a-b to expose sections of polysilicon layer 60 and to form lines A, B, C and D. Then, a relatively thin layer of silicon nitride (Si$_3$N$_4$) is deposited, and a silicon dioxide layer is thermally grown as a nitride steam seal to form NO dielectric layer 26 (FIG. 3) adjacent the exposed sections of lines A, B, C and D. Next, a polysilicon layer is deposited, implanted with n+ type dopants, annealed, patterned and etched to form lines 1, 2, 3, 4, 5 and 6 shown in FIG. 2 and FIG. 3.

Referring to FIG. 2, a silicon dioxide layer (not shown) is deposited, followed by a patterning of contact regions 22a-d and 24a-f and by an etching at the patterned contact regions 22a-d and 24a-f through all oxide and nitride layers to lines A, B, C, D, 1, 2, 3, 4, 5 and 6. Aluminum metal is deposited, patterned and etched to form multiple interconnects to lines A, B, C, D, 1, 2, 3, 4, 5 and 6 through contact regions 22a-d and 24a-f, respectively. Finally, metal sinter is performed.

Figure 4C:
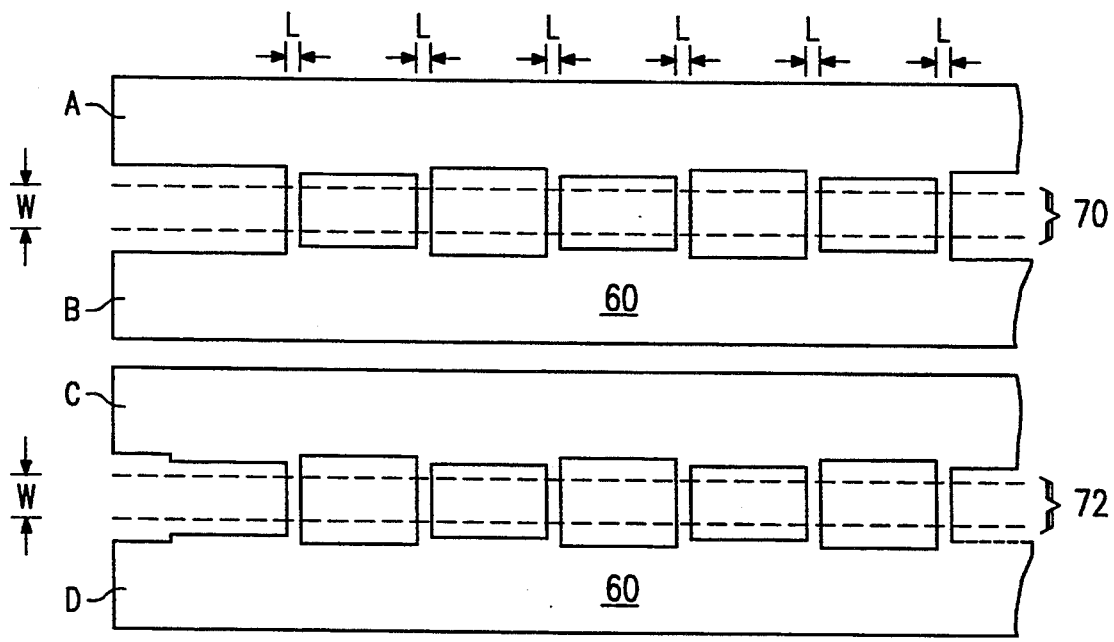
FIG. 4c illustrates a processing step alternative to FIG. 4b.

FIG. 4c illustrates a processing step alternative to FIG. 4b. According to this alternative, after depositing TEOS oxide layer 30 (FIG. 3), slots 70 and 72 are patterned as shown in FIG. 4c, instead of patterning antifuse windows 40a-b, 42a-b, 44a-b, 46a-b, 48a-b and 50a-b (FIG. 4b). An oxide/polysilicon stacked etch is used to cut through patterned slots 70 and 72, so that both TEOS oxide layer 30 and polysilicon layer 60 are etched in the areas of slots 70 and 72 to form lines A, B, C and D. Then, the formation of NO dielectric layer 26 and subsequent processing steps are the same as discussed further hereinabove in connection with FIGS. 4a-b.

Advantageously, the processing alternative illustrated in FIG. 4c potentially enables increased density of antifuse regions in antifuse array layout 10. For example, in FIG. 2, the proximity of lines 1, 2, 3, 4, 5 and 6 relative to one another is a function of the minimum practical distance achievable between antifuse windows 40a-b, 42a-b, 44a-b, 46a-b, 48a-b and 50a-b. Further, the minimum achievable width W of slots 70 and 72 (FIG. 4c) is potentially smaller than the minimum achievable dimensions of antifuse windows 40a-b, 42a-b, 44a-b, 46a-b, 48a-b and 50a-b (FIG. 4b). Nevertheless, the processing step alternative illustrated in FIG. 4c is not preferred, because the polysilicon layer subsequently deposited in slots 70 and 72 might be difficult to sufficiently etch below the upper surface of TEOS oxide layer 30 in order to form separate lines 1, 2, 3, 4, 5 and 6. Comparatively, below the upper surface of TEOS oxide layer 30 in the preferred embodiment, separate lines 1, 2, 3, 4, 5 and 6 are self-aligned to antifuse windows 40a-b, 42a-b, 44a-b, 46a-b, 48a-b and 50a-b, such that etching of the polysilicon layer (which forms lines 1, 2, 3, 4, 5 and 6) is more readily performed only above the upper surface of TEOS oxide layer 30.

Figure 5:
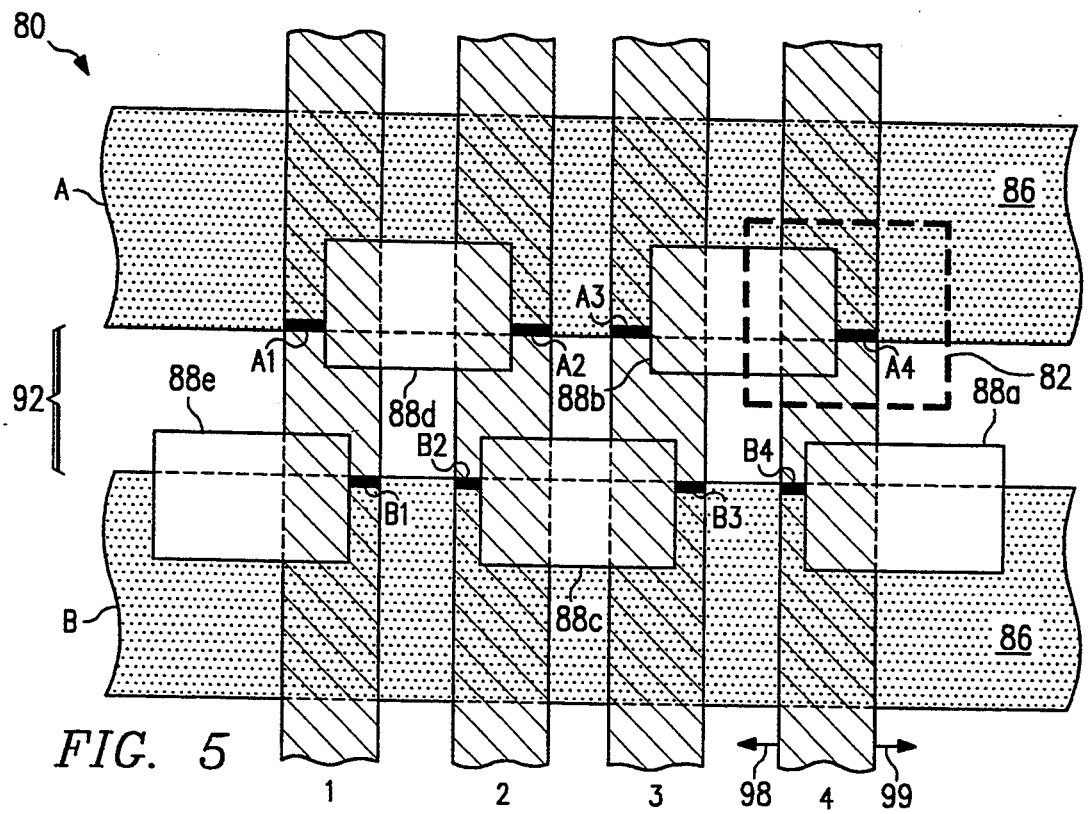
FIG. 5 is a plan view of an antifuse structure of an alternative embodiment.
Figure 6:
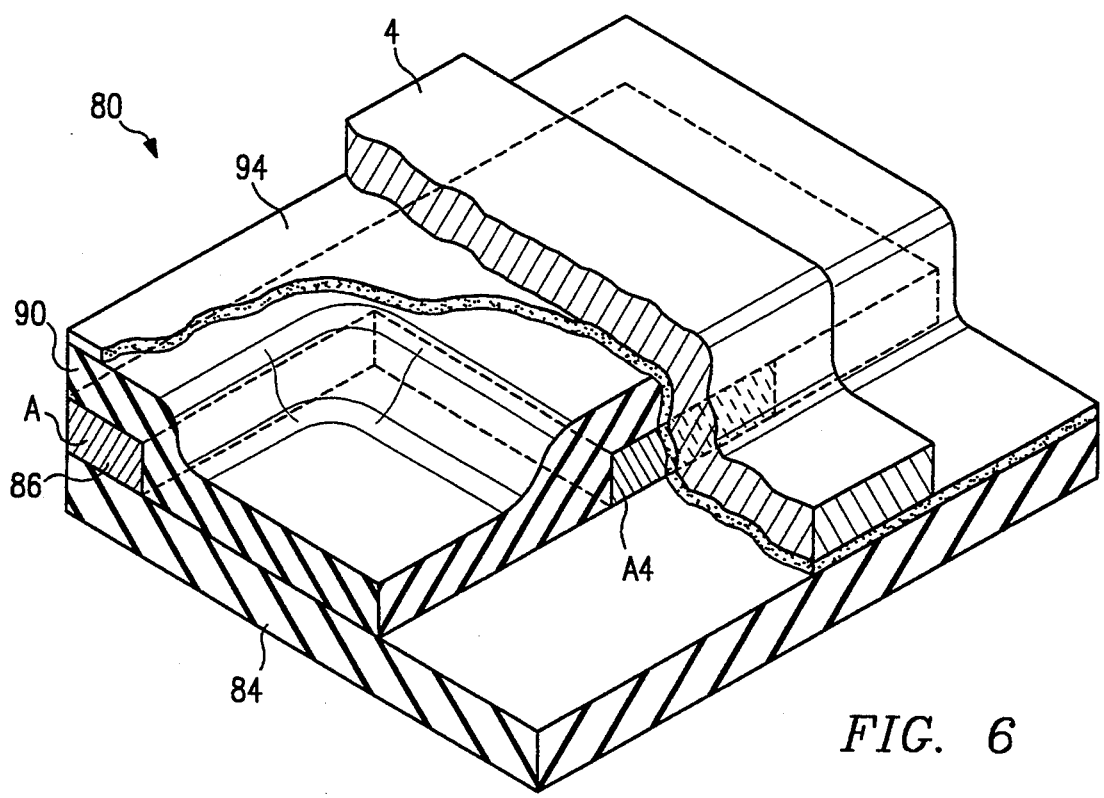
FIG. 6 is a perspective view of the antifuse structure of FIG. 5.

FIG. 5 is a plan view of an antifuse structure, indicated generally at 80, of an alternative embodiment. FIG. 6 is a perspective view of antifuse structure 80 in the region of dashed enclosure 82 of FIG. 5. In fabricating antifuse structure 80 of FIGS. 5 and 6, a thick oxide layer 84 (FIG. 6) is thermally grown over an entire area on which antifuse structure 80 is to be formed. Over thick oxide layer 84, a conductive LPCVD polysilicon layer 86 is deposited at a thickness of approximately 2000-4000 Angstroms and then etched according to a mask having the pattern shown in FIG. 5 by solid boxes 88a-e.

After etching polysilicon layer 86, n+ type phosphorous or arsenic dopants are implanted and annealed in polysilicon layer 86. Then, a TEOS oxide layer 90 (FIG. 6) is deposited at a thickness of approximately 2000 Angstroms. After depositing TEOS oxide layer 90 (FIG. 6), a slot 92 is patterned as shown in FIG. 5. An oxide/polysilicon stacked etch is used to cut through patterned slot 92, so that both TEOS oxide layer 90 and polysilicon layer 86 are etched in the area of slot 92 to expose sections of polysilicon layer 86 and to form lines A and B.

Then, a relatively thin layer of silicon nitride (Si$_3$N$_4$) is deposited, and a silicon dioxide layer is thermally grown as a nitride steam seal to form NO dielectric layer 94 (FIG. 6) adjacent the exposed sections of lines A and B. Next, a polysilicon layer is deposited, implanted with n+ type dopants, annealed, patterned and etched to form lines 1, 2, 3, and 4 shown in FIG. 5. The formation of contact regions and subsequent processing steps are the same as discussed further hereinabove in connection with FIGS. 4a-b.

By increasing the sizes of solid boxes 88a–e, the areas of antifuse regions A1–A4 and B1–B4 are diminished. Moreover, FIGS. 5 and 6 show that the area of antifuse region A4 can be diminished by offsetting line 4 relative to line A in the direction of arrow 98 (FIG. 5). Advantageously, as line 4 is offset relative to lines A and B in the direction of either arrow 98 or 99, the sum of the areas of antifuse regions A4 and B4 is substantially constant. Thus, the capacitance of line 4 is substantially independent of its offset or misalignment relative to lines A and B in the directions of arrows 98 and 99.

Likewise, the respective capacitances of lines 1, 2, and 3 are substantially independent of their offsets relative to lines A and B in the directions of arrows 98 and 99. Accordingly, antifuse structure 80 of FIGS. 5 and 6 potentially achieves more uniform performance relative to antifuse structure 20 of FIGS. 2 and 3. Nevertheless, antifuse structure 80 is not preferred, because it potentially occupies a larger amount of semiconductor fabrication area relative to antifuse structure 20.

Figure 7A:
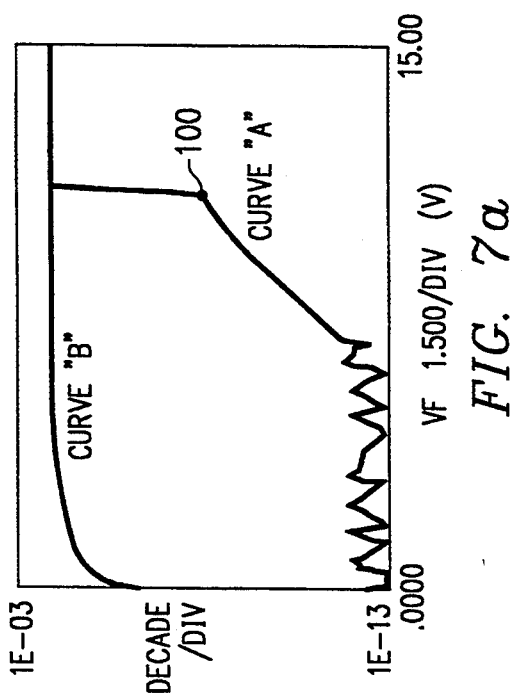
FIGS. 7a-b are graphs of I-V characteristics of the antifuse structure of FIG. 2.

FIG. 7a is a graph of I-V characteristics of antifuse structure 20 of FIG. 2, having a thickness t (FIG. 3) of approximately 2000 Angstroms, a width L (FIG. 2) of approximately 0.2 $\mu$m, and a total antifuse cell size of approximately 0.2×0.2 $\mu$m$^2$. FIG. 7a shows the I-V characteristics of one of lines A–D relative to one of lines 1–6. The two lines can be connected by programming a corresponding antifuse region.

Curve "A" shows the I-V characteristics before programming the corresponding antifuse region, and curve "B" shows the I-V characteristics after programming without soaking. The corresponding antifuse region is programmed at point 100 on Curve "A". With the same programming condition, antifuse structure 20 has an on-resistance approximately 50–150 ohms higher than planar antifuse structures of previous techniques. The higher on-resistance is primarily due to an additional one or two squares of polysilicon sheet resistance contributed by the sublithographic line width L shown in FIGS. 2 and 4a–b.

Figure 7B:
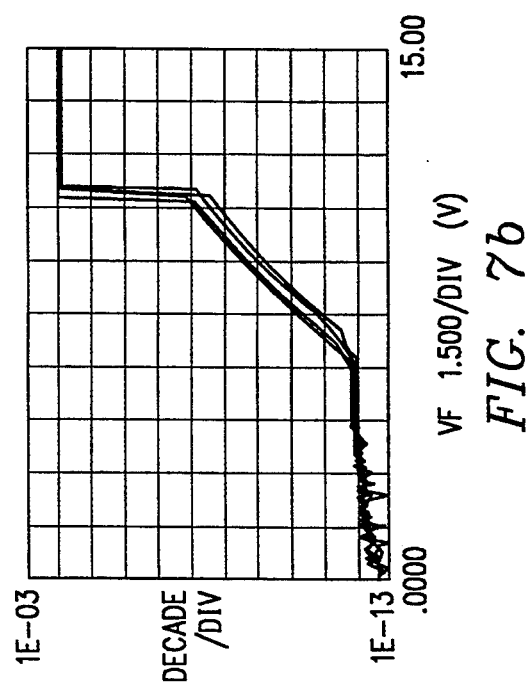

FIG. 7b further shows I-V characteristics of antifuse structure 20 of FIG. 2, having a thickness t of approximately 4000 Angstroms, various widths L of approximately 0.3 $\mu$m, 0.4 $\mu$m, 0.6 $\mu$m, and 0.8 $\mu$m, and various total antifuse cell sizes of approximately 0.3×0.4 $\mu$m$^2$, 0.4×0.4 $\mu$m$^2$, 0.6×0.4 $\mu$m$^2$, 0.8×0.4 $\mu$m$^2$.

Relative to previous techniques for fabricating antifuse structures within contact holes, the sublithographic antifuse techniques of the preferred and alternative embodiments advantageously reduce antifuse area by more than approximately one order of magnitude. According to previous techniques for conventional contact-hole antifuse structures, an approximately 0.2 $\mu$m lithographic capability would be relied upon to achieve an equivalent antifuse cell size. By comparison, the techniques of the preferred and alternative embodiments do not rely upon such advanced lithography techniques. Also, the sidewall antifuse structures of the preferred and alternative embodiments reduce the unprogrammed antifuse capacitance, thereby increasing circuit speed performance and reducing interconnect switching power dissipation.

Figure 8:
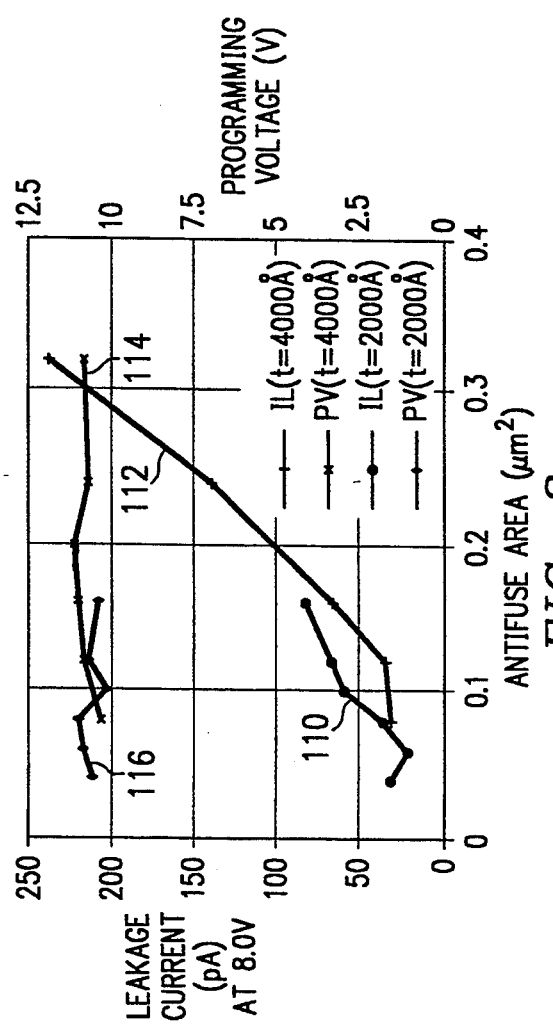
FIG. 8 is a graph of leakage current and of programming voltage, each as a function of antifuse area, for the antifuse structure of FIG. 2.

FIG. 8 is a graph of leakage "tunneling" current (curves 110 and 112) and of programming "breakdown" voltage (curves 114 and 116), each as a function of antifuse area, for antifuse structure 20 of FIG. 2 having various thicknesses t (FIG. 3) of approximately 2000 Angstroms and of approximately 4000 Angstroms. Leakage current (curves 110 and 112) is measured at approximately 8.0 volts due to the difficulty in measuring extremely low currents at low voltages.

The thin dielectric tunneling current (curves 110 and 112) at approximately 8.0 volts is generally proportional to the antifuse area. By comparison, the programming voltage (curves 114 and 116) remains substantially constant even as antifuse area decreases. Based on these characteristics, NO dielectric layer 26 is substantially uniform for all sizes of antifuses. The offset from 0.0 V in curves 110 and 112 is possibly due to a slight overestimate of actual antifuse area, which can be verified by capacitance measurements.

Figure 9:
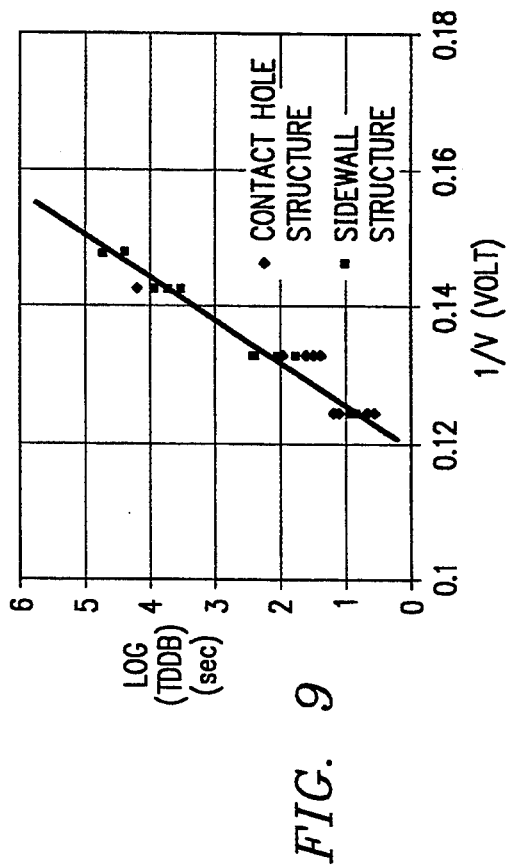
FIG. 9 is a graph of time-dependent dielectric breakdown ("TDDB") reliability of the antifuse structure of FIG. 2.

FIG. 9 is a graph of time-dependent dielectric breakdown ("TDDB") reliability of sidewall antifuse structure 20 of FIG. 2, having a groove perimeter of approximately 50,000 $\mu$m and a thickness t of approximately 0.4 $\mu$m. The TDDB data of FIG. 9 were measured at room temperature from wafers within the same manufacturing run, so that a direct comparison between sidewall antifuse structure 20 and conventional planar contact-hole antifuse structures can be made with reasonable accuracy. The TDDB data of FIG. 9 show that the TDDB reliability of sidewall antifuse structure 20 is comparable to that of conventional planar contact-hole antifuse structures having areas of approximately 200 $\mu$m×200 $\mu$m.

The total antifuse area for a fixed number of antifuses in a given circuit is greatly reduced by the small dimensions of sublithographic antifuse structures 20 (FIGS. 2 and 3) and 80 (FIGS. 5 and 6). Accordingly, sublithographic antifuse structures 20 and 80 reduce the wafer yield loss from defects in a large area of dielectric. Advantageously, the small antifuse areas of sublithographic antifuse structures 20 and 80 reduce leakage current before programming. Moreover, antifuse structures 20 and 80 are readily adaptable to field-programmable gate array applications.

Although the present invention and its advantages have been described in detail, it should be understood that various changes, substitutions and alterations can be made therein without departing from the spirit and scope of the invention as defined by the appended claims.

What is claimed is:

1. A method of fabricating an antifuse structure, comprising the steps of:
   depositing a first conductive layer;
   etching said first conductive layer according to a first mask having a first pattern;
   etching said first conductive layer according to a second mask having a second pattern;
   forming a first insulative layer over said first conductive layer;
   etching said first insulative layer according to a third mask having a third pattern to expose at least one section of said first conductive layer;
   forming a second insulative layer adjacent at least one said exposed section of said first conductive layer; and
   depositing a second conductive layer over said second insulative layer so that the antifuse structure includes at least one antifuse region where a section of said second insulative layer is adjacent said first and second conductive layers, said antifuse region having a sublithographic vertical dimension according to a thickness of said first conductive layer and having a sublithographic horizontal dimension according to an overlap between said first and second masks.

2. The method of claim 1 wherein said step of etching said first insulative layer comprises the step of etching said first conductive layer.

3. The method of claim 1 wherein said step of etching said first insulative layer comprises the step of etching an antifuse window in said first insulative layer.

4. The method of claim 3 wherein said antifuse window etching step comprises the step of etching said antifuse window in said first insulative layer so that multiple antifuse regions are situated in said antifuse window.

5. The method of claim 1 wherein said step of etching said first insulative layer comprises the step of etching a slot in said first insulative layer.

6. The method of claim 1 wherein said step of depositing said first conductive layer comprises the step of depositing a polysilicon layer.

7. The method of claim 1 and further comprising the step of implanting and annealing dopants in said first conductive layer.

8. The method of claim 1 and further comprising the step of programming said antifuse region to connect said first and second conductive layers.

9. The method of claim 8 wherein said programming step comprises the step of applying a programming voltage between said first conductive layer and said second conductive layer.

10. The method of claim 8 wherein said programming step comprises the step of melting said second insulative layer in said antifuse region.

11. A method of fabricating an antifuse structure, comprising the steps of:

depositing a first conductive layer;

etching said first conductive layer according to a first mask having a first pattern;

forming a first insulative layer over said first conductive layer;

etching said first insulative layer according to a second mask having a second pattern to expose at least one section of said first conductive layer;

forming a second insulative layer adjacent at least one said exposed section of said first conductive layer; and depositing a second conductive layer over said second insulative layer so that the antifuse structure includes at least one antifuse region where a section of said second insulative layer is adjacent said first and second conductive layers, said antifuse region having a sublithographic vertical dimension according to a thickness of said first conductive layer and having a sublithographic horizontal dimension according to an offset of said second conductive layer relative to said first conductive layer.

12. The method of claim 11 and further comprising the step of etching said second conductive layer to form a plurality of second lines, so that the antifuse structure includes a plurality of antifuse regions each having an associated sublithographic horizontal dimension according to an offset of an associated one of said second lines relative to said first conductive layer.

* * * * *